(12) United States Patent
Harari et al.

(10) Patent No.: US 10,608,008 B2
(45) Date of Patent: Mar. 31, 2020

(54) 3-DIMENSIONAL NOR STRINGS WITH SEGMENTED SHARED SOURCE REGIONS

(71) Applicant: Sunrise Memory Corporation, Los Gatos, CA (US)

(72) Inventors: Eli Harari, Saratoga, CA (US); Raul Adrian Cernea, Santa Clara, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 0 days.

(21) Appl. No.: 16/006,612

(22) Filed: Jun. 12, 2018

(65) Prior Publication Data

US 2018/0366485 A1 Dec. 20, 2018

Related U.S. Application Data

(60) Provisional application No. 62/522,665, filed on Jun. 20, 2017.

(51) Int. Cl.

| | |
|---|---|
| *G11C 16/04* | (2006.01) |
| *H01L 27/11578* | (2017.01) |
| *G11C 7/18* | (2006.01) |
| *H03K 19/20* | (2006.01) |
| *H03K 19/1776* | (2020.01) |
| *G11C 16/08* | (2006.01) |
| *G11C 16/24* | (2006.01) |
| *H01L 29/786* | (2006.01) |

(52) U.S. Cl.
CPC ......... *H01L 27/11578* (2013.01); *G11C 7/18* (2013.01); *G11C 16/0466* (2013.01); *G11C 16/08* (2013.01); *G11C 16/24* (2013.01); *H03K 19/1776* (2013.01); *H03K 19/20* (2013.01); *H01L 29/78696* (2013.01)

(58) Field of Classification Search
None
See application file for complete search history.

(56) References Cited

U.S. PATENT DOCUMENTS

| | | | | | |
|---|---|---|---|---|---|
| 5,583,808 | A | * | 12/1996 | Brahmbhatt | ....... G11C 16/0491 |
| | | | | | 365/185.05 |
| 5,646,886 | A | * | 7/1997 | Brahmbhatt | ....... G11C 16/0491 |
| | | | | | 365/185.05 |
| 6,130,838 | A | * | 10/2000 | Kim | ................. H01L 27/11521 |
| | | | | | 365/185.17 |

(Continued)

*Primary Examiner* — Tan T. Nguyen
(74) *Attorney, Agent, or Firm* — Edward C. Kwok; VLP Law Group, LLP

(57) ABSTRACT

A NOR string includes a number of individually addressable thin-film storage transistors sharing a bit line, with the individually addressable thin-film transistors further grouped into a predetermined number of segments. In each segment, the thin-film storage transistors of the segment share a source line segment, which is electrically isolated from other source line segments in the other segments within the NOR string. The NOR string may be formed along an active strip of semiconductor layers provided above and parallel a surface of a semiconductor substrate, with each active strip including first and second semiconductor sublayers of a first conductivity and a third semiconductor sublayer of a second conductivity, wherein the shared bit line and each source line segment are formed in the first and second semiconductor sublayers, respectively.

9 Claims, 4 Drawing Sheets

(56) References Cited

U.S. PATENT DOCUMENTS

2001/0030340 A1* 10/2001 Fujiwara ................ B82Y 10/00
 257/314
2009/0316487 A1* 12/2009 Lee ..................... G11C 11/5628
 365/185.22
2014/0328128 A1* 11/2014 Louie ................ H01L 21/26586
 365/185.17

* cited by examiner

3-DIMENSIONAL NOR STRINGS WITH SEGMENTED SHARED SOURCE REGIONS

CROSS REFERENCES TO RELATED APPLICATIONS

This application is related to and claims priority of U.S. provisional patent application ("Provisional Application"), Ser. No. 62/522,665, entitled "3-Dimensional NOR Strings with Segmented Shared Source Regions," filed Jun. 20, 2017. This application is also related to copending U.S. patent application ("Copending Non-provisional application"), Ser. No. 15/248,420, entitled "Capacitive-Coupled Non-Volatile Thin-film Transistor Strings in Three-Dimensional Arrays," filed Aug. 26, 2016 and now published as U.S. 2017/0092371. The Provisional Application and the Copending Non-provisional application are hereby incorporated by reference in their entireties. References to the Copending Non-provisional application herein are made by paragraph numbers of the publication.

BACKGROUND OF THE INVENTION

1. Field of the Invention

The present invention relates to non-volatile NOR-type memory strings. In particular, the present invention relates to 3-dimensional semiconductor structures including arrays of non-volatile NOR-type memory strings.

2. Discussion of the Related Art

The Copending Non-provisional application discloses a 3-dimensional array of memory transistors organized as NOR strings in a semiconductor structure. Each such NOR strings includes a large number of individually addressable thin-film storage transistors ("TFTs") sharing a common or shared drain region and a common or shared source region, As discussed in paragraph [0159] of the Copending Non-provisional application, when a TFT in a NOR string is addressed and read, the cumulative off-state source-drain leakage current due to the large number of other TFTs (e.g., thousands) in the NOR string may interfere with the read current of the addressed TFT. To avoid such a large leakage current, one may consider having a shorter NOR string (i.e., a NOR string with fewer TFTs). However, for a given number of TFTs in an array of memory strings, a lesser number of TFTs in each NOR string results in a greater total number of sense amplifiers and string decoders required in the array, thereby increasing the chip cost.

SUMMARY

According to one embodiment of the present invention, a NOR string includes: a number of individually addressable thin-film storage transistors sharing a bit line, with the individually addressable thin-film transistors further grouped into a predetermined number of segments. In each segment, the thin-film storage transistors of the segment share a source line segment, which is electrically isolated from other source line segments in the other segments within the NOR string. The NOR string may be formed along an active strip of semiconductor layers provided above and parallel a surface of a semiconductor substrate, with each active strip including first and second semiconductor sublayers of a first conductivity and a third semiconductor sublayer of a second conductivity, wherein the shared bit line and each source line segment are formed in the first and second semiconductor sublayers, respectively.

A NOR string of the present invention may further include a conductive sublayer provided adjacent the first semiconductor sublayer to provide a low-resistivity path in the shared bit line, which may be selectively electrically connected to circuitry formed in the semiconductor substrate.

A NOR string of the present invention may be one of a number of like NOR strings formed one on top of another in a stack of active strips. The stack of active strips may, in turn, be part of a number of like stacks of active strips organized as an array of NOR strings.

Within each segment in a NOR string of the present invention, one or more pre-charge transistors may be provided to connect the shared bit line and the corresponding source line segment.

According to one embodiment of the present invention, a process for forming a memory structure includes: (i) forming circuitry in a semiconductor substrate, the semiconductor substrate having a planar surface; (ii) forming multiple active layers, with successive active layers being isolated from each other by isolation layers, each active layer comprising first and second semiconductor sublayers of a first conductivity type, a third semiconductor layer of a second conductivity type opposite the first conductivity type; (iii) patterning and etching the active layers anisotropically to form a first system of trenches from the top of the active layers along a first direction substantially perpendicular to the planar surface, such that each trench extends lengthwise along a second direction substantially parallel to the planar surface; (iv) filling the first set of trenches with a sacrificial material; (v) patterning and etching the sacrificial material anisotropically along the first direction to form a second set of trenches running lengthwise along a third direction substantially parallel the planar surface and substantially orthogonal to the second direction, thereby exposing a portion of each of the plurality of active layers; and (vi) isotropically etching the exposed portions of the active layers to remove exposed portions of the first, second and third semiconductor sublayers of each active layer.

In one embodiment, a process of the present invention provides, in each active layer, a conductive layer adjacent the first semiconductor sublayer that is resistant to the isotropically etching step.

Subsequent to the isotropically etching step, the process may further include: (i) selectively removing the sacrificial material from the first set of trenches to expose the active layers; (ii) providing a charge-trapping layer in trenches over the exposed active layers; (iii) filling the first of trenches with a conductive material; and (iv) patterning and anisotropically etching the conductive material to provide pillars of conductive material;

The present invention is better understood upon consideration of the detailed description below in conjunction with the accompanying drawings.

DETAILED DESCRIPTION OF THE PREFERRED EMBODIMENTS

Figure 1A:
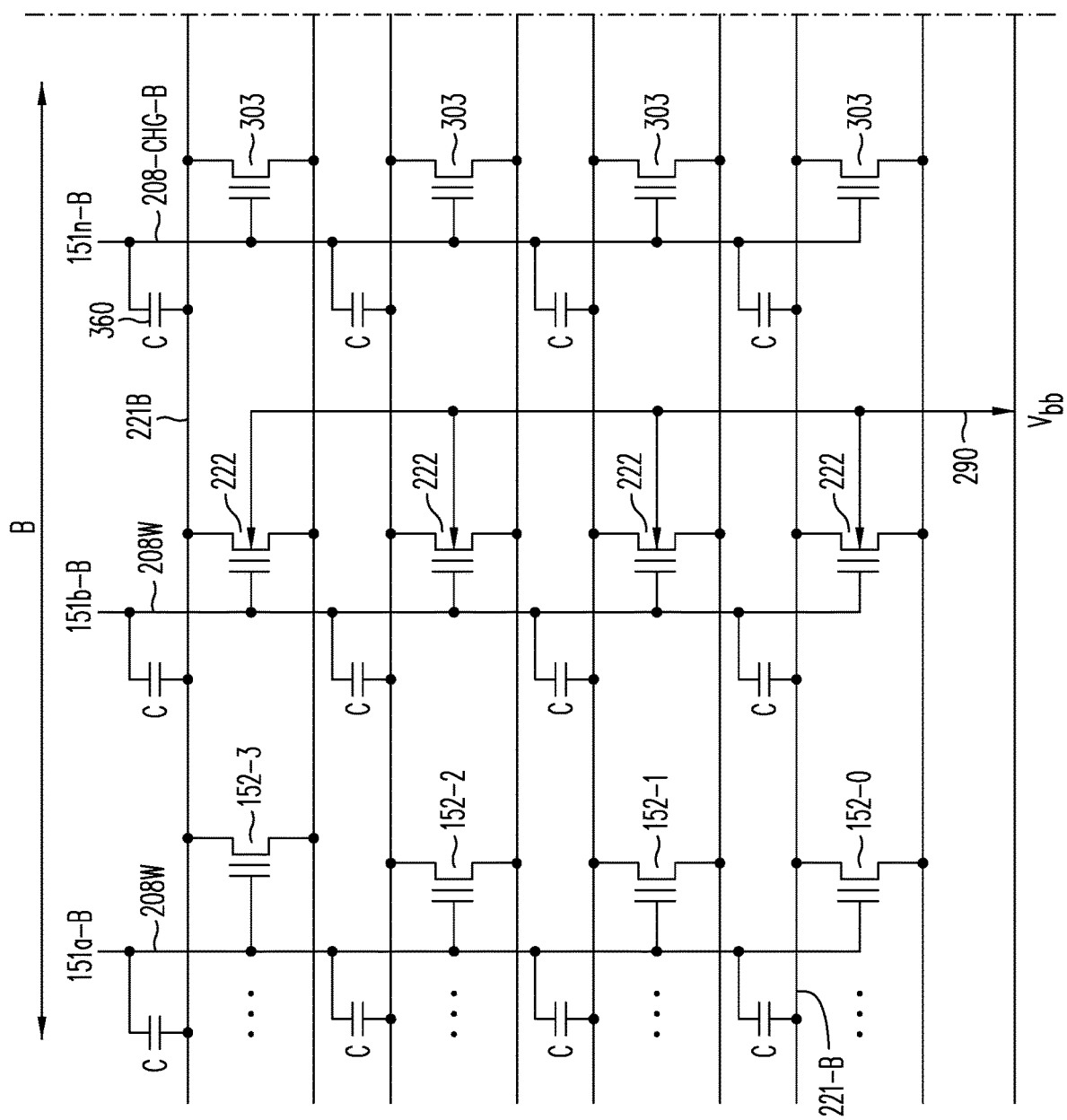
FIGS. 1a and 1b show circuit schematic in which NOR strings 202-0, 202-1, 202-2 and 202-3 are formed in a stack, one on top of each other and separated from each other by insulator layers (not shown), in accordance with one embodiment of the present invention.
Figure 1B:
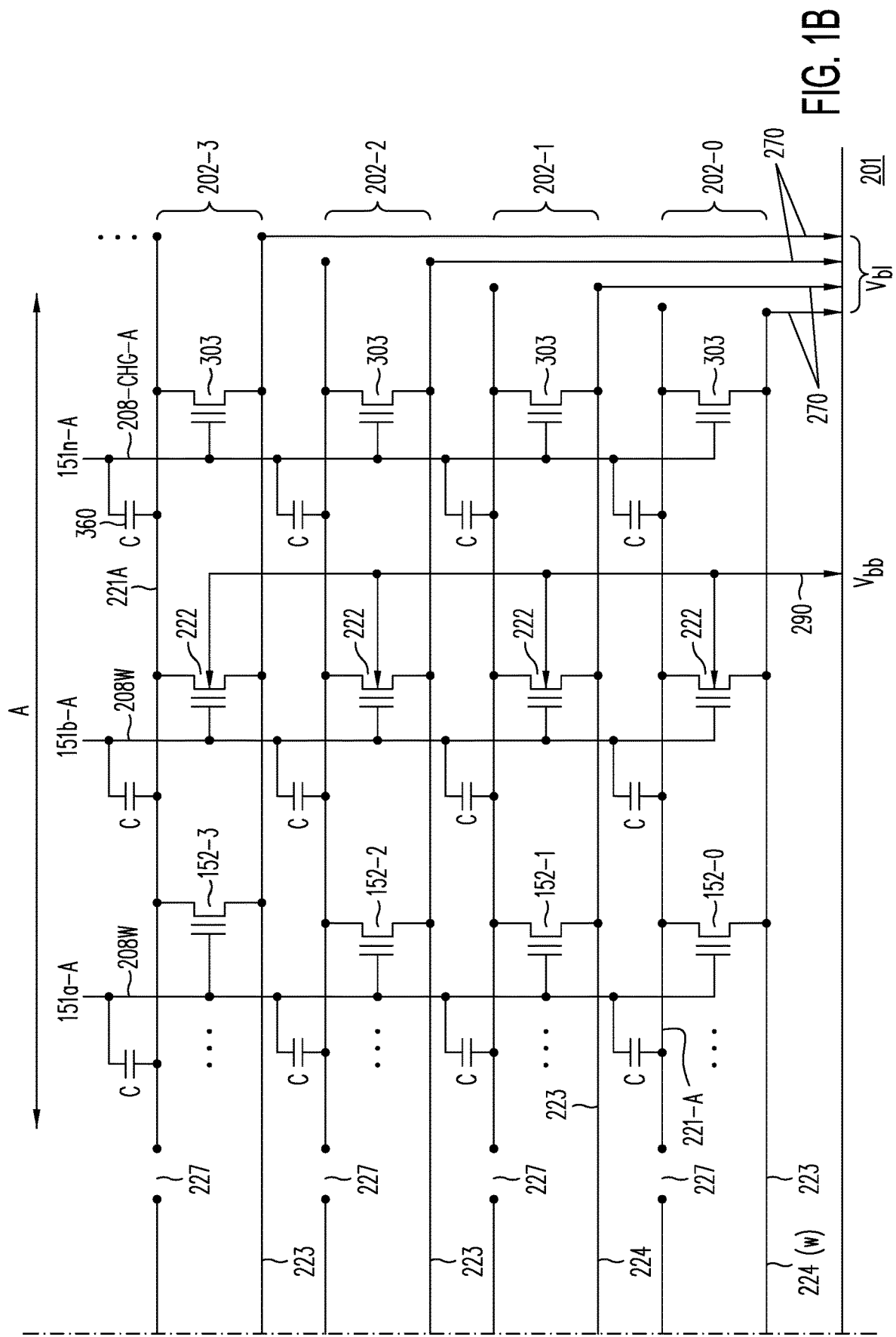

The present invention allows a memory array to be formed out of longer NOR strings, yet the memory array enjoys the benefits of a lesser leakage current as if it is formed out of much shorter NOR strings. FIG. 1 shows a circuit schematic in which NOR strings 202-0, 202-1, 202-2 and 202-3 are formed in a stack, one on top of each other and separated by an insulator (not shown), in accordance with one embodiment of the present invention. As shown in FIG. 1, each NOR string is provided a shared drain sublayer or bit-line 223 that is typically an N+ polysilicon layer that is preferably strapped by a narrow thin strip of low resistivity metallic interconnect 224 (e.g., Tungsten (W), Cobalt (Co) or another metallic material or a silicide). Each NOR string in FIG. 1 is also provided a shared source sublayer 221 (typically also N+ polysilicon), channel sublayer 222, typically p− polysilicon, and conductor word lines (e.g., word lines 151a and 151b). Of importance, shared bit-line sublayer 224 is continuous along the entire length of each NOR string, while electrical continuity in shared source sublayer 221 is interrupted at positions indicated by reference numeral 227, thereby dividing shared source sublayer 221 into a number of source line segments. Positions 227, where electrical connectivity in the shared source sublayer is interrupted, may be distributed at regular intervals. In some embodiments, as discussed in the Copending Non-provisional application, during reading, programming or erase operations, shared source sublayer 221 may be pre-charged from shared drain sublayer 223 through a TFT in the NOR string to a predetermined voltage. The voltage is then maintained by the parasitic capacitance as a virtual voltage source in shared source sublayer 223 during the remainder of the read, programming or erase operation.

In FIG. 1, positions 227 of NOR strings 202-0 to 202-3 are aligned, forming string segments A and B in each NOR string. Each such string segment may include, for example, 1,024 TFTs, so that eight string segments may be provided in a NOR string of 8,192 TFTs. All string segments in each NOR string are serviced by a single continuous, conducting shared bit-line 224. As shown in FIG. 1, each such string segment may incorporate pre-charge TFTs (e.g., pre-charge TFTs 208-CHG-A and 208-CHG-B). Such pre-charge TFTs may be a dedicated TFT in each string segment or alternatively, supplied by any TFT in the string segment. In these NOR strings, the pre-charge TFTs momentarily transfer the voltage on the bit line to their respective source line segment.

The segmented NOR string of the present invention is achieved by severing the source sublayer of each NOR string into individual source line segments, while retaining electrical continuity of the drain sublayer or bit line 224 sublayer along the entire length of the NOR string, spanning all string segments. Under such a scheme, during a read operation, only the source line segment that includes the addressed TFT contributes to the source-drain leakage current of the entire NOR string, while all other source line segments are pre-charged to the same voltage as that of the bit line, thereby eliminating their leakage current contributions. Although the segmentation requires an additional space to separate neighboring source line segments, the space can be a reasonably small area penalty. Another advantage of segmenting the source sublayer is achieved because the capacitance of each source line segment is correspondingly smaller than that of the full-string source capacitance, resulting in a lower power dissipation and a faster pre-charge.

Figure 2:
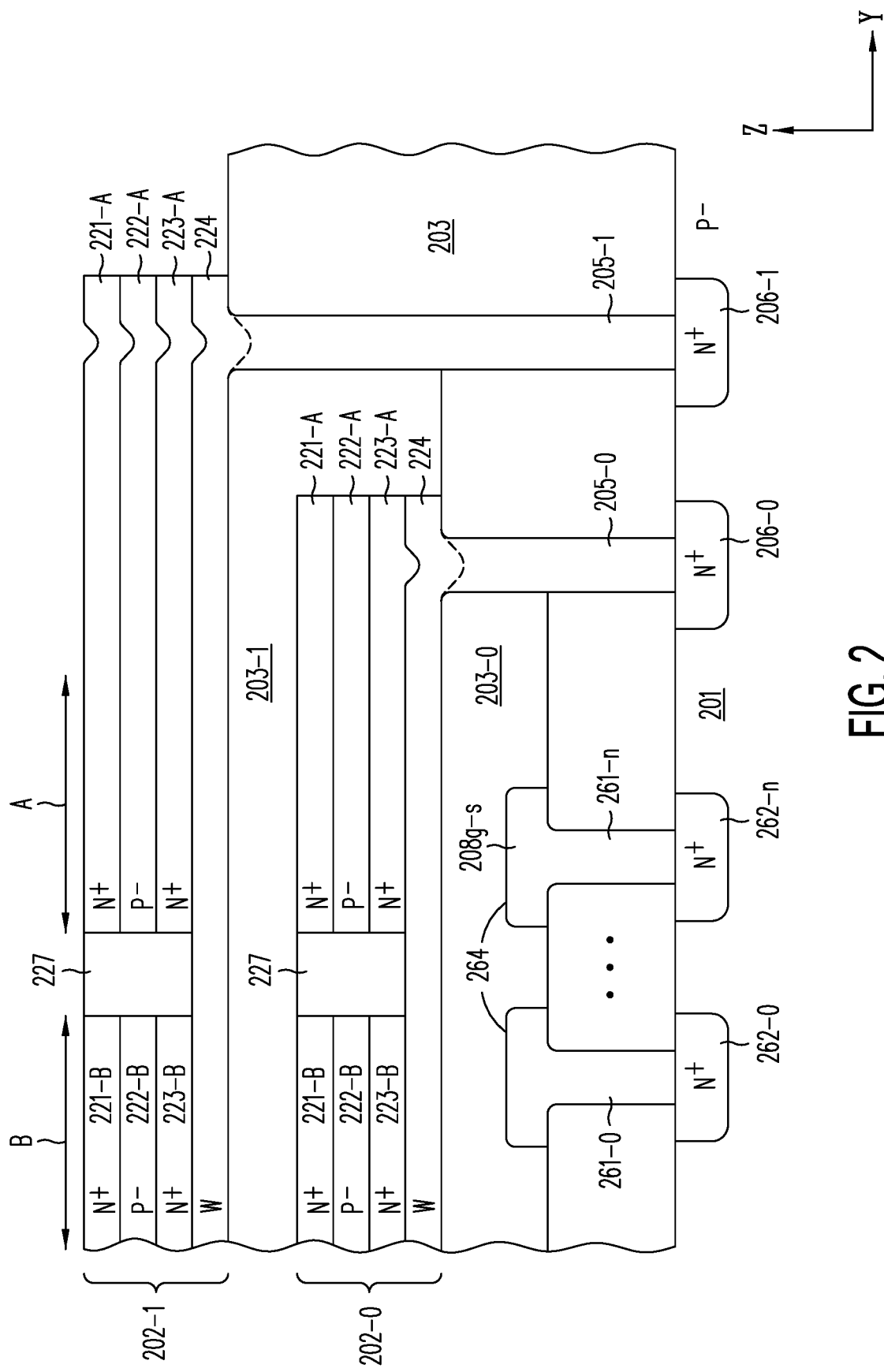
FIG. 2 shows a cross section of NOR strings 202-0 and 202-1 after a selective etch to create the source line segments, resulting in the two separate string segments A and B in each NOR string, in accordance with one embodiment of the present invention.

A selective-etch process may be applied to the NOR string structure to form the separations at positions 227 between adjacent source line segments. FIG. 2 shows a cross section of NOR strings 202-0 and 202-1 after the selective etch to create the source line segments, resulting in the two separate string segments A and B, in accordance with one embodiment of the present invention. The structure of FIG. 2 results from applying the selective etch on a variation of the structure shown in FIG. 2 of the Copending Non-provisional application. (Unlike the structure shown in Copending Non-provisional application, tungsten layer 224 is provided at the bottom—rather than the top—of the active layers forming NOR strings 202-1 and 202-2.)

As shown in FIG. 2, each of NOR strings 202-1 and 202-2 are formed out of stacked active layers, with each active layer including $N^+$ sublayer 221 (the common source sublayer), $P^-$ sublayer 222 (the channel sublayer), sublayer 223 (the common drain sublayer or bit line) and conducting layer 224 (e.g., tungsten). The selective-etching process cuts $N^+$ sublayer 221, $P^-$ sublayer 222, and $N^+$ sublayer 223, without etching into conducting layer 224. As conducting layer 224 is not etched, the segments 223-A and 223-B of $N^+$ sublayer 223 (i.e., the shared bit line) remains electrically connected.

FIG. 2 also shows that conductive layer 224 of each NOR string (e.g., NOR strings 202-0 and 202-1) are connected through respective buried contacts (e.g., buried contacts 205-0 and 205-1) to circuitry formed in semiconductor substrate 201. Such circuitry may include, for example, sense amplifiers and voltage sources. In addition, a system of global interconnect conductors 264 (e.g., global interconnect conductors 208g-s), which may be used to connect local word lines (not shown) along the NOR strings to circuitry in semiconductor substrate 201. As shown in FIG. 2, global interconnect conductors 208g-s are each connected by a buried contact (e.g., any of buried contact 261-0 to 261-n) to a corresponding (i.e., one of contacts 262-0 to 262-n) in semiconductor substrate 201.

Figure 3:
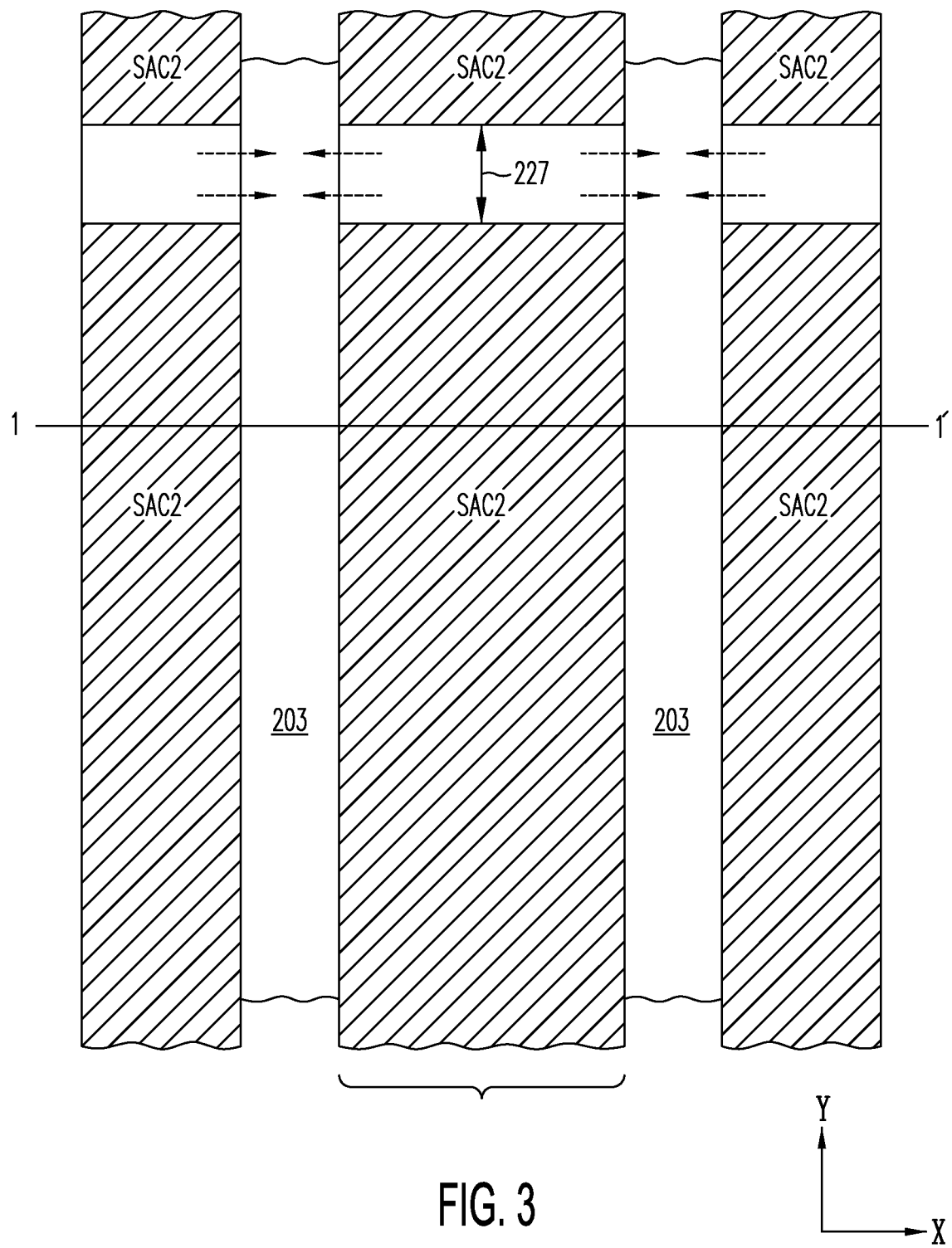
FIG. 3 illustrates a process that can be used to carry out a selective etch described herein, according to one embodiment of the present invention.

FIG. 3 illustrates a process that can perform the selective-etch described above. FIG. 3 is a top view of the NOR string array after the stacks of active layers are formed by patterning and anisotropically etching trenches running lengthwise along the Y-direction and in depth through the active layers. Initially, a number of active layers are formed, sublayer by sublayer, successively, with each active layer isolated from each other by an insulation layer. After the active layers are formed, insulator layer 203 is formed over the active layers. The resulting structure is then patterned and anisotropically etched. The resulting stacks of active layers that remain are the portions in FIG. 3 that are capped by insulation layer 203. The trenches are then filled using a sacrificial material SAC2, which may be, for example, a silicon oxide. A second set of trenches running lengthwise along the X-direction of width indicated in FIG. 3 by reference numeral 227 are etched all the way down the SAC2 material, thereby exposing the side edges of sublayers 221, 222, 223 and 224. A selective-etch then etches away the exposed semiconductor sublayers 221, 222, and 223, while leaving essentially in-tact conductive sublayers 224. Thereafter, the second set of trenches may be subsequently filled with an insulator, if desired. Sacrificial material SAC2 may then be selectively removed. Storage material (e.g., charge-trapping material) and local word line conductors are subsequently provided in these trenches resulting from removal of the SAC2 material.

The detailed description above is provided to illustrate specific embodiments of the present invention and is not intended to be limiting. Numerous variations and modifications within the scope of the present invention are possible. The present invention is set forth by the accompanying claims.

We claim:

1. A NOR string, comprising;
a bit line;
first and second source lines that are electrically isolated from each other;
individually addressable first, second, third and fourth thin-film storage transistors sharing the bit line, wherein the first and second thin-film storage transistors share the first source line.

2. The NOR string of claim 1, wherein the first, second, third and fourth thin-film storage transistors of the NOR string are formed along an active strip of semiconductor layers provided above and parallel a surface of a semiconductor substrate, the active strip comprising first and second semiconductor sublayers of a first conductivity and a third semiconductor sublayer of a second conductivity, wherein the bit line is formed in the first semiconductor sublayer, and wherein the first and second source lines are formed in the second semiconductor sublayer.

3. The NOR string of claim 2, further comprising a conductive layer provided adjacent the first semiconductor sublayer, the conductive sublayer providing a low-resistivity path in the bit line.

4. The NOR string of claim 3, wherein the bit line is selectively electrically connected to circuitry formed in the semiconductor substrate.

5. The NOR string of claim 2, wherein the NOR string is one of a plurality of like NOR strings formed one on top of another in a stack of active strips.

6. The NOR string of claim 5, wherein the stack of active strips is one of a plurality of like stacks of active strips separated from each other by trenches running lengthwise along a first direction.

7. The NOR string of claim 6, wherein the first and second source lines of each NOR string are separated from each other by an insulation material provided in a trench running along a second direction substantially orthogonal to the first direction.

8. The NOR string of claim 1 further comprising first and second pre-charge transistors that are provided to connect the first and second source lines, respectively, with the bit line.

9. The NOR string of claim 8 wherein, during a read or programming operation on the first or second thin-film storage transistor in the NOR string, the second source line of the NOR string and the bit line are held at substantially the same voltage.

* * * * *